(12) United States Patent
Xu

(10) Patent No.: US 10,993,014 B1
(45) Date of Patent: Apr. 27, 2021

(54) INTEGRATED CIRCUIT PACKAGES IN HEADPHONES AND METHOD FOR FORMING AND OPERATING THE SAME

(71) Applicant: Airtouch (Shanghai) Intelligent Technology Co.,Ltd, Shanghai (CN)

(72) Inventor: Naihao Xu, Shanghai (CN)

(*) Notice: Subject to any disclaimer, the term of this patent is extended or adjusted under 35 U.S.C. 154(b) by 0 days.

(21) Appl. No.: 17/128,196

(22) Filed: Dec. 21, 2020

(51) Int. Cl.
| | |
|---|---|
| *H01L 23/00* | (2006.01) |
| *H04R 1/10* | (2006.01) |
| *H01L 49/02* | (2006.01) |
| *H01L 23/498* | (2006.01) |
| *H04R 5/033* | (2006.01) |
| *G01B 7/24* | (2006.01) |

(52) U.S. Cl.
CPC ............ *H04R 1/1041* (2013.01); *G01B 7/24* (2013.01); *H01L 23/49816* (2013.01); *H01L 24/16* (2013.01); *H01L 28/10* (2013.01); *H04R 1/1016* (2013.01); *H04R 5/033* (2013.01); *H01L 2224/16227* (2013.01); *H01L 2924/15321* (2013.01); *H01L 2924/19042* (2013.01); *H01L 2924/19106* (2013.01); *H04R 2420/07* (2013.01)

(58) Field of Classification Search
CPC ........... H01L 23/3107; H01L 23/49816; H01L 23/49838; H01L 23/5227; H01L 23/5389; H01L 24/16; H01L 24/24; H01L 24/43; H01L 24/48; H01L 24/49; H01L 24/81; H01L 28/10

See application file for complete search history.

(56) References Cited

U.S. PATENT DOCUMENTS

| | | | | |
|---|---|---|---|---|
| 2020/0082969 | A1* | 3/2020 | Hua | .................. H01L 23/49827 |
| 2020/0321301 | A1* | 10/2020 | Mitarai | ............. H01L 23/49838 |
| 2021/0057803 | A1* | 2/2021 | Hiramatsu | ............... A61B 5/00 |

* cited by examiner

*Primary Examiner* — Cuong Q Nguyen
(74) *Attorney, Agent, or Firm* — Whitewood Law PLLC; Shengmao Mu

(57) ABSTRACT

Embodiments of the present disclosure provide an integrated circuit package in a true wireless stereo (TWS) headphone. The integrated circuit package includes a package substrate, an inductor structure, a sensing chip, and a semiconductor device. The inductor structure is on a first surface of the package substrate configured to sense a deformation of the TWS headphone. The sensing chip is attached to a second surface of the package substrate and configured to sense an inductance change in the inductor structure. The semiconductor device is attached to the second surface of the package substrate configured to process a sensed inductance change.

20 Claims, 6 Drawing Sheets

INTEGRATED CIRCUIT PACKAGES IN HEADPHONES AND METHOD FOR FORMING AND OPERATING THE SAME

CROSS-REFERENCE TO RELATED APPLICATIONS

This application claims the benefit of priority to Chinese Patent Application No. 202010901074.8 filed on Oct. 29, 2020, which is incorporated herein by reference in its entirety.

BACKGROUND

Embodiments of the present disclosure relate to wireless audio systems.

Loudspeakers, including headphones, have been widely used in daily life. Headphones are a pair of small loudspeaker drivers worn on or around the head over a user's ears, which convert an electrical signal to a corresponding sound.

Wired headphones, however, constrain the users' movement because of the wires (cords), and are particularly inconvenient during exercise. Conventional wireless headphones no longer need the wires between the headphones and the audio sources, but still require the wires between the left and right headphones.

SUMMARY

Embodiments of integrated circuit packages, a method for forming the integrated circuit package, and a method for operation control using the integrated circuit package are disclosed herein.

In one example, an integrated circuit package in a true wireless stereo (TWS) headphone includes a package substrate, an inductor structure, a sensing chip, and a semiconductor device. The inductor structure is on a first surface of the package substrate configured to sense a deformation of the TWS headphone. The sensing chip is attached to a second surface of the package substrate and configured to sense an inductance change in the inductor structure. The semiconductor device is attached to the second surface of the package substrate configured to process a sensed inductance change.

In another example, a method for operation control in TWS headphones, performed by an integrated circuit. The method includes sensing, by an inductor structure, a deformation of the TWS headphone. The inductor structure is positioned on a first surface of a package substrate and facing a metal film attached to a shell of the TWS headphones. The method also includes sensing, by a sensing chip, an inductance change in the inductor structure. The sensing chip is positioned on a second surface of the package substrate, the second surface being on an opposite side of the package substrate. The sensing chip is positioned on a second surface of the package substrate, the second surface being on an opposite side of the package substrate. The method further includes processing the sensed inductance change, by a semiconductor device positioned on a second surface of the package substrate, the second surface being on an opposite side of the package substrate. The method yet includes determining, by the semiconductor device, the deformation of the shell based on the inductance change and determining, by the semiconductor device, an operation of the TWS headphones, the sensing chip, based on the deformation of the shell.

In a different example, an integrated circuit package in a TWS headphone includes a package substrate, an inductor structure, a sensing chip, and a motherboard. The inductor structure is on a first surface of the package substrate. The sensing chip is attached to a second surface of the package substrate and configured to sense an inductance change caused by an interaction between the inductor structure and a metal film attached to a shell of the TWS headphones. The motherboard is attached to the second surface of the package substrate and configured to process an electrical signal from the sensing chip. The electrical signal reflects the inductance change.

This Summary is provided merely for purposes of illustrating some embodiments to provide an understanding of the subject matter described herein. Accordingly, the above-described features are merely examples and should not be construed to narrow the scope or spirit of the subject matter in this disclosure. Other features, aspects, and advantages of this disclosure will become apparent from the following Detailed Description, Figures, and Claims.

BRIEF DESCRIPTION OF THE DRAWINGS

The accompanying drawings, which are incorporated herein and form part of the specification, illustrate the presented disclosure and, together with the description, further serve to explain the principles of the disclosure and enable a person of skill in the relevant art(s) to make and use the disclosure.

Figure 1:
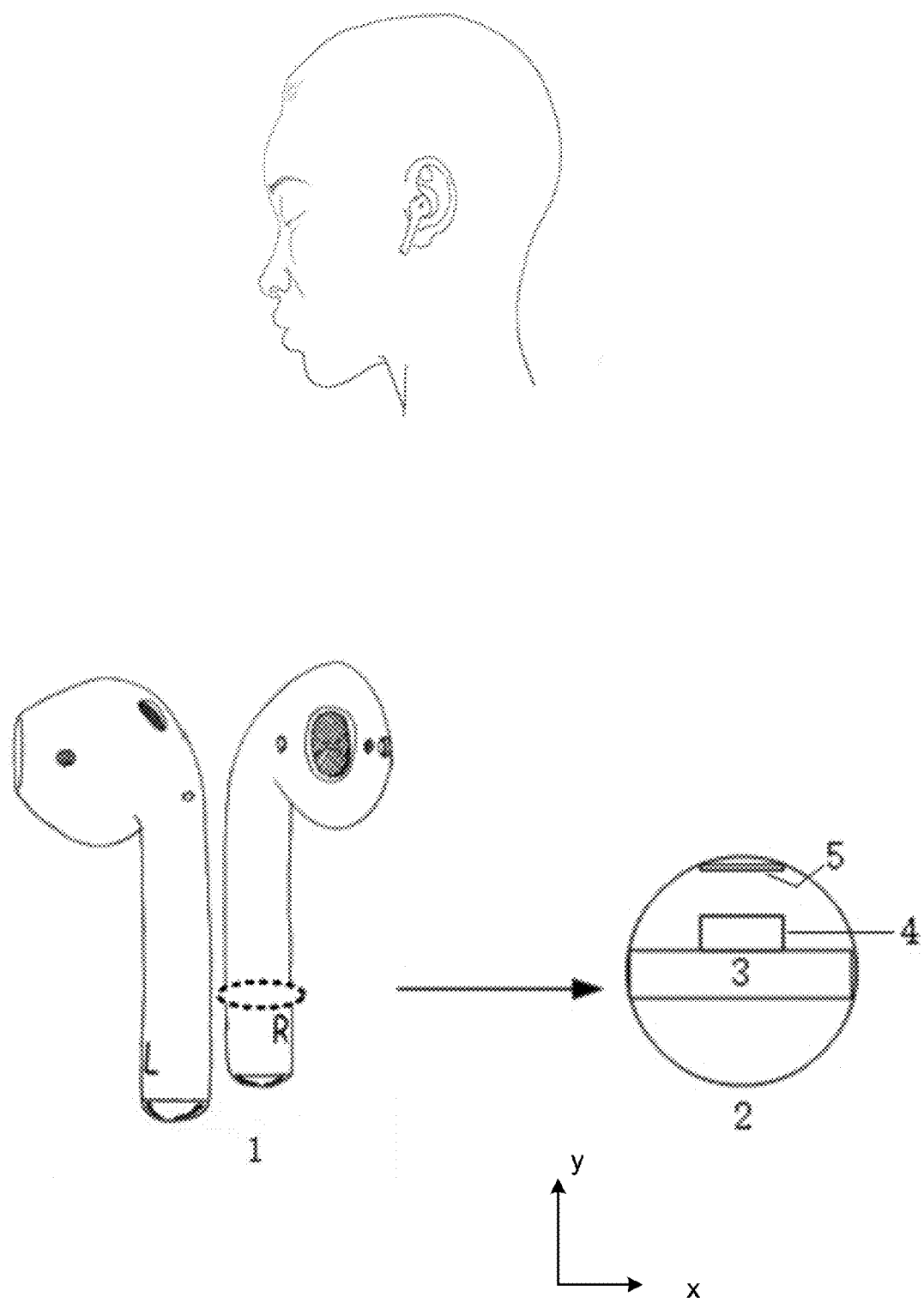
FIG. 1 illustrates an existing integrated circuit package in a TWS headphone.

The presented disclosure is described with reference to the accompanying drawings. In the drawings, generally, like reference numbers indicate identical or functionally similar elements. Additionally, generally, the left-most digit(s) of a reference number identifies the drawing in which the reference number first appears.

DETAILED DESCRIPTION

Although specific configurations and arrangements are discussed, it should be understood that this is done for illustrative purposes only. It is contemplated that other configurations and arrangements can be used without departing from the spirit and scope of the present disclosure. It is further contemplated that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it is contemplated that such feature, structure or characteristic may also be used in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

True wireless stereo (TWS) headphones (also known as untethered headphones) is a type of wireless headphones that remove the wires between the left and right headphones. In some TWS headphones, inductive pressure sensing technology is employed for the users to control the operations of the TWS headphones. For example, a user can press a designated portion of a TWS headphone and changing the pressing strength and duration to control/change the operations of the TWS headphone(s). Often, for the TWS headphone to sense the pressing, an inductor (e.g., inductance coils) and a sensing chip are paired in the TWS headphone. When a user is pressing the TWS headphone, the sensing chip can sense the inductance change in the inductor, caused by the deformation of the TWS headphone. The TWS headphone (or the controller coupled to the sensing chip in the TWS headphone) can sense the pressing based on the electrical signal sent by the sensing chip. In a response, the TWS headphone can then determine the operations based on the pressing.

In existing TWS headphones, the inductor is often formed or mounted on a printed circuit board (PCB). It often requires an undesirably large area to form/mount an inductor on the PCB, e.g., due to wiring or fabrication reasons. As a result, the inductor formed/mounted on a PCB can be undesirably bulky. It is thus difficult to further reduce the volume of the TWS headphone containing the inductor. Also, the TWS headphones with the existing inductor can undesirably increase the complexity of module design and fabrication during manufacturing, and can be costly.

FIG. 1 illustrates an existing a pair of TWS headphones and a cross-sectional view 2 of a bottom end of a TWS headphone 1. As shown in FIG. 1, TWS headphone 1 employs a sensing chip (not shown) to sense the inductance change caused by the deformation of the TWS headphone, when the user presses the bottom end of TWS headphone 1. The deformation may be referred to as a change in shape as a result of pressure. In this disclosure, the deformation refers to the change of the shell of a TWS headphone due to the pressing by a user. TWS headphone 1 includes a motherboard 3, an inductor 4, and a metal film 5. Inductor 4 is formed/mounted on a PCB, which is attached to an upper surface of motherboard 3. Metal film 5 is placed to be in contact with or neighboring the shell of TWS headphone 1. When the user press TWS headphone 1 on the shell, the shell undergoes deformation, which causes a distance between metal film 5 and inductor 4 to change. Vortex phenomenon in inductor 4 can cause the inductance of inductor 4 to decrease. The sensing chip can sense the inductance change and generate an electrical signal (e.g., electric current) in response to the inductance change. Motherboard 3 can receive the electrical signal, and determines/controls operations of TWS headphone 1 based on the electrical signal.

As previously explained, because inductor 4 is formed/mounted on a PCB, inductor 4 (and/or the PCB mounting inductor 4) can be bulky. In TWS headphone 1, inductor 4 can occupy an undesirably large space, making it difficult to reduce the volume of TWS headphone 1. Also, the fabrication of inductor 4 on PCB can be complex and costly. Besides, inductor 4 is often a separate part from motherboard 3 and needs to be assembled with motherboard 3. This can make the integration of TWS headphone 1 more complex.

As will be disclosed in detail below, among other novel features, the present disclosure provide a TWS headphone with an integrated circuit package in which an inductor structure is integrated with a package substrate for providing electrical enclosure. The sensing chip can also be integrated with the package substrate. Electrical connection between the inductor structure and a motherboard can be facilitated through the package substrate. Specifically, a ball grid array (BGA) packaging method is used in connecting the package substrate and the motherboard such that electrical signals can be transmitted amongst the motherboard, the sensing chip, and the inductor structure through the solder balls formed from the BGA packaging method. The inductor structure can be formed or mounted on the package substrate, and the package substrate can be bonded with the motherboard through flip-chip bonding. The disclosed device and methods can reduce the space taken by the inductor structure, thus leaving more space in the TWS headphone or reducing the volume of the TWS headphone. Meanwhile, the inductor structure is integrated with the motherboard through the package substrate, increasing the integration level of the TWS headphone, and making it easier to assemble and/or operate the TWS headphone.

Additional novel features will be set forth in part in the description which follows, and in part will become apparent to those skilled in the art upon examination of the following and the accompanying drawings or may be learned by production or operation of the examples. The novel features of the present disclosure may be realized and attained by practice or use of various aspects of the methodologies, instrumentalities, and combinations set forth in the detailed examples discussed below.

Figure 2A:
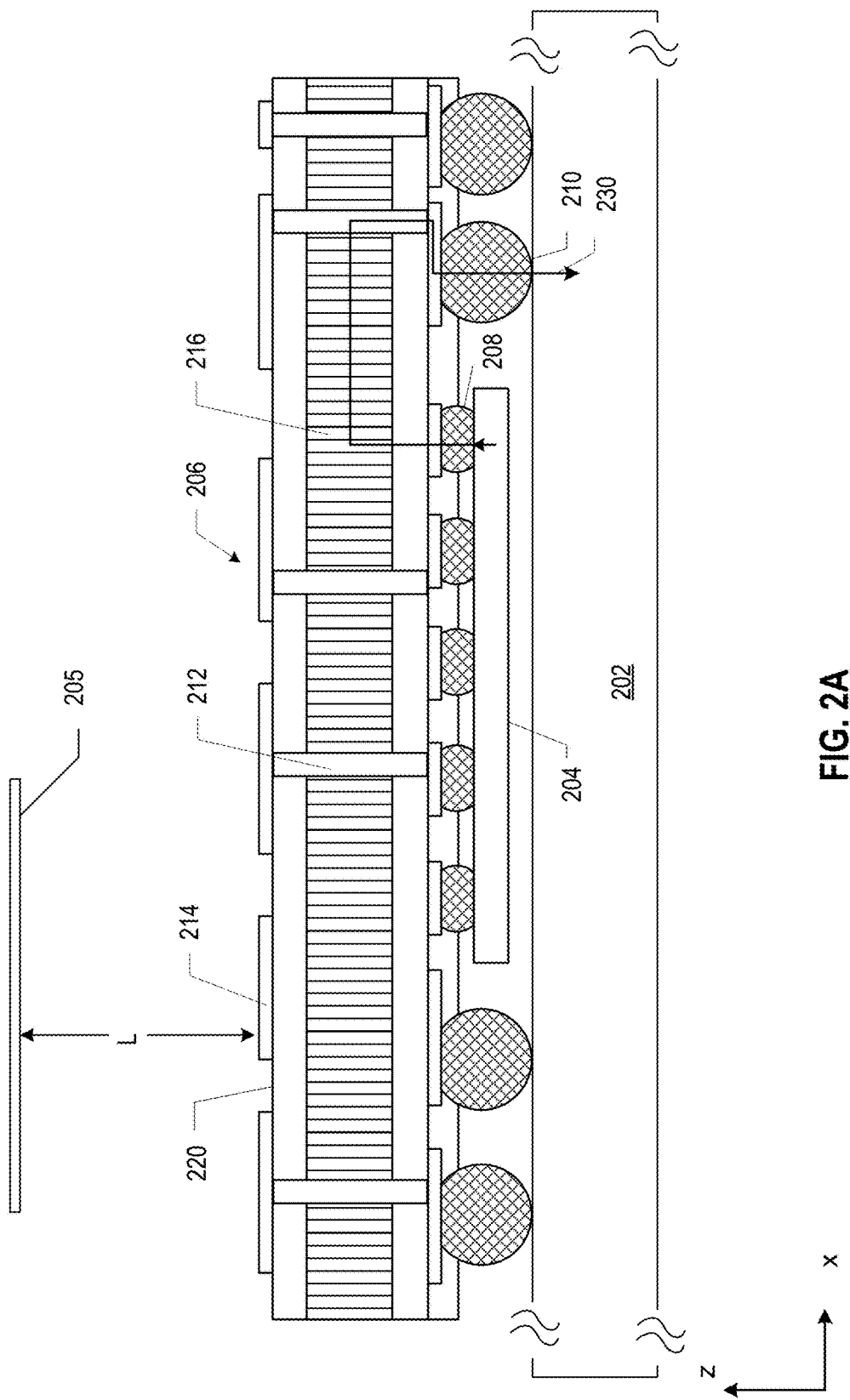
FIG. 2A is a cross-sectional view of an exemplary integrated circuit package in accordance with embodiments of the present disclosure.
Figure 2B:
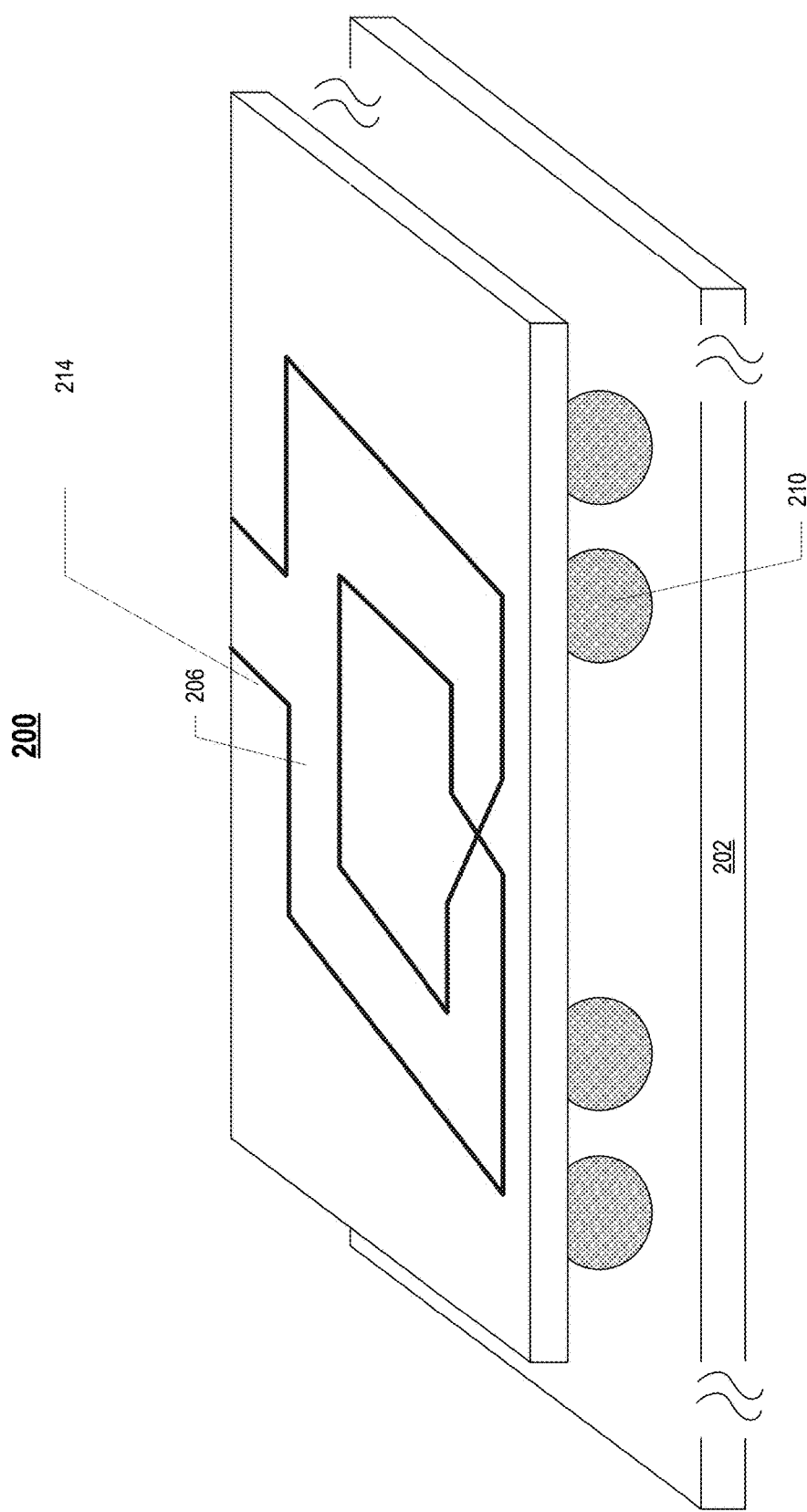
FIG. 2B is a perspective view of the integrated circuit package including an inductor structure illustrated in FIG. 2A, in accordance with embodiments of the present disclosure.
Figure 3:
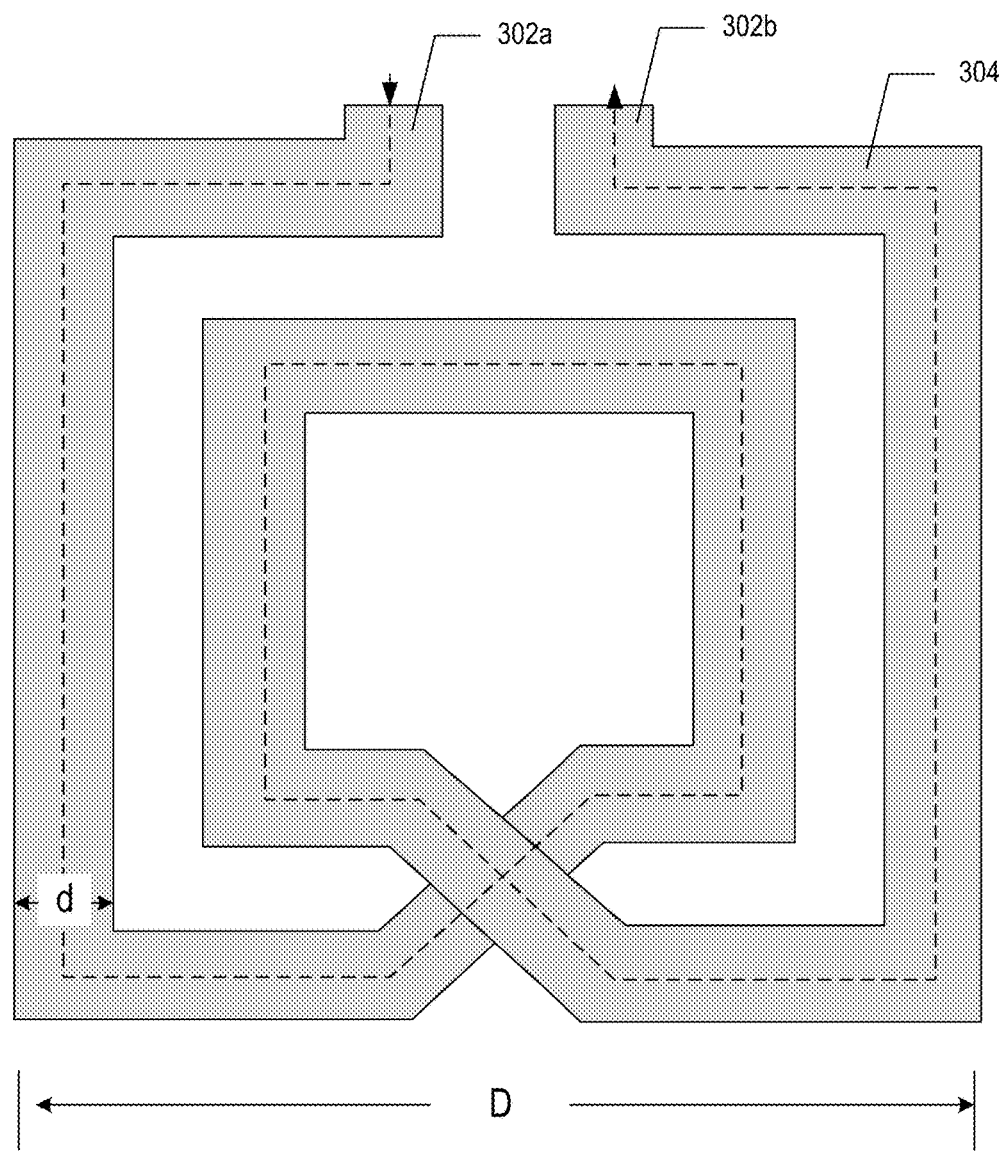
FIG. 3 is a top view of an exemplary inductor structure in the integrated circuit package in accordance with embodiments of the present disclosure.

FIG. 2A is a cross-sectional view of an exemplary integrated circuit package 200 in a TWS headphone, according to embodiments of the present disclosure. FIG. 2B is a perspective view of integrated circuit package 200. FIG. 2B further illustrates the spatial relationship amongst various parts, including an inductor structure, in integrated circuit package 200. FIG. 3 illustrates an exemplary layout of an inductor structure. For ease of description, FIGS. 2A, 2B, and 3 are described together. As shown in FIGS. 2A and 2B, integrated circuit package 200 may include a motherboard 202, a package substrate 206, an inductor structure 214, and a sensing chip 204. Inductor structure 214 may be mounted on or formed on package substrate 206. Sensing chip 204 may be attached/bonded onto package substrate 206. Package substrate 206 may be attached/bonded onto motherboard 202 through flip-chip bonding and BGA bonding method.

Motherboard 202 may include any suitable device and/or platform that is configured to control various operations of the TWS headphone and sensing chip 204. For example, motherboard 202 may include a controller which includes a PCB and components such as a processor, a communication interface, a memory, and a storage on the PCB. In various embodiments, motherboard 202 can generally represent any suitable semiconductor device, with control functions, on which a package substrate (e.g., package substrate 206) can be bonded onto. The processor may include any appropriate type of general-purpose or special-purpose microprocessor, digital signal processor, or microcontroller. The processor may be configured as a stand-alone processor module dedicated to analyzing the electrical signal sent by sensing chip 204 or a shared processor module for performing other functions unrelated to the analysis of the electric signal. The communication interface may send and receive data from components, such as sensing chip 204 and/or inductor structure 214, via a Wireless Local Area Network (WLAN), wireless communication links such as radio waves, a cellular network, and/or a local or short-range wireless network (e.g., Bluetooth™), or other communication methods. In some embodiments, the communication interface can be an integrated services digital network (ISDN) card, cable modem, satellite modem, or a modem to provide a data communication connection. In some embodiments, the communication interface can send and receive electrical, electromagnetic or optical signals that carry digital data streams representing various types of information.

The memory and the storage may include any appropriate type of mass storage provided to store any type of information that the processor may need to operate. The memory and/or the storage may be volatile or non-volatile, magnetic, semiconductor-based, tape-based, optical, removable, non-removable, or other type of storage device or tangible (i.e., non-transitory) computer-readable medium including, but not limited to, a read-only memory (ROM), a flash memory, a dynamic random-access memory (RAM), a static RAM, a hard disk, an solid-state drive (SSD), an optical disk, etc. The memory and/or the storage may be configured to store information and data received by the processor, and store one or more computer programs that may be executed by the processor to perform functions disclosed herein. For example, the memory and/or the storage may be configured to store data representing the electrical signal sent by sensing chip 204. In another example, the memory and/or storage may be configured to store program(s) that may be executed by the processor to analyze the electrical signal sent by sensing chip 204 and control the operations of the TWS headphones based on the result of the signal analysis.

Package substrate 206 be configured to conceal some/all parts of integrated circuit package 200, except for inductor structure 214, e.g., may include any suitable package substrate that provide the package with mechanical base support and electrical interfaces that facilitate electrical communication amongst some/all parts in the package and allow an external circuitry to access the devices housed in the package. Package substrate 206 may also be configured to provide sealing effectiveness of the electrical enclosure (e.g., integrated circuit package 200) against intrusion from foreign bodies (e.g., tools, dirt etc.) and moisture. For example, package substrate 206 may provide mechanical support to certain structures coupled to motherboard 202 and facilitate electrical connection amongst some or all components that are operatively coupled to motherboard 202. Package substrate 206 may include a suitable BGA substrate that can be conductively coupled to motherboard 202. Package substrate 206 may include a base substrate 220 with a plurality of pins on a surface (e.g., a lower surface) of the base substrate. The area of the upper surface of package substrate 206 may be sufficiently large to place any desirable devices, such as inductor structure 214. The pins may be in contact with and conductively connected to a plurality of first solder balls 208 and a plurality of second solder balls 210 that are arranged in a grid-like pattern and can be connected to various devices and areas for conducting electrical current. Base substrate 220 may include a multi-layer structure such as one or more conductive layers and vias 212 embedded in an insulating material. For example, the insulating material in base structure 220 may include any suitable insulating material such as plastic, polymer, resin, glass, ceramic, or a combination thereof. The conductive layers and vias 212 in base structure 220 may include any suitable conductive materials such as copper, aluminum, cobalt, tungsten, silicides, or a combination thereof. Vias 212 may be conductively connected to inductor structure 214 and first and second solder balls 208 and 210 to facilitate electrical connection amongst inductor structure 214, sensing chip 204, and motherboard 202. For example, vias 212 may be in contact with inductor structure 214 and first and second solder balls 208 and 210. In some embodiments, the conductive layers include an interposer layer 216 between the upper and lower surfaces of base structure 220 for connecting and re-directing electrical signals transmitted amongst inductor structure 214, sensing chip 204, and motherboard 202. Interposer layer 216 may be in contact with and conductively connected to some or all vias 212, and may re-direct the electrical signals to a designated device/location.

Package substrate 206 may include a plurality of first solder balls 208 and a plurality of second solder balls 210 on the lower surface of base substrate 220. First and second solder balls 208 and 210 may include any suitable material that can be soldered onto base structure 220 to provide electrical connection between base structure 220 and motherboard 202. For example, first and second solder balls 208 and 210 may include tin (Sn) and/or copper (Cu). In some embodiments, first solder balls 208 may be conductively connected to sensing chip 204. For example, first solder balls 208 may be in contact with certain pins on sensing chip 204 such that electrical signals can be transmitted from and to sensing chip 204 through package substrate 206 (e.g., interposer layer 216 and vias 212). In some embodiments, second solder balls 210 may be conductively connected to motherboard 202. For example, second solder balls 210 may be in contact with certain pins on motherboard 202 such that electrical signals can be transmitted from and to motherboard 202 through packing substrate 206 (e.g., interposer layer 216 and vias 212). Thus, motherboard 202 may be configured to control the operations of inductor structure 214 and sensing chip 204 through package substrate 206. For example, electrical signals may be transmitted amongst motherboard 202, sensing chip 204, and inductor structure 214 through first solder balls 208, second solder balls 210, interposer layer 216, and/or vias 212. Motherboard 202, sensing chip 204, and inductor structure 214 may thus be operatively coupled to one another through package substrate 206.

Inductor structure 214 may include any suitable inductor(s) that can be formed on and/or mounted on package substrate 206 (i.e., base substrate 220) and configured to undergo an inductance change when deformation is caused on the shell of the TWS headphone in which integrated circuit package 200 is positioned. For example, inductor structure 214 may include a laminated core inductor, an air core inductor, a ferrite core inductor, a Bobbin inductor, a toroidal core inductor, an axial inductor, a shielded surface mount inductor, a planar inductor, a coupled inductor, a multi-layer chip inductor, a shielded variable inductor, and a combination thereof. Inductor structure 214 may include any suitable conductive material and/or ferromagnetic material that can generate inductance when electrical current flows through. For example, inductor structure 214 may include copper. In some embodiments, inductor structure 214 is conductively connected to, e.g., operatively coupled to, sensing chip 204 through package substrate 206 and first solder balls 208. In some embodiments, inductor structure 214 is conductively connected to, e.g., operatively coupled to, motherboard 202 through package substrate 206 and second solder balls 210.

In some embodiments, inductor structure 214 includes a planar inductor, which has a coil 304 arranged in one layer. FIG. 3 illustrates a layout of inductor structure 214. The dashed line represents an exemplary direction along which electrical current may flow. As an example, electrical current can flow between two differential terminals 302a and 302b (or taps). In some embodiments, 302a is an input terminal and 302b is an output terminal, and electrical current flows from 302a to 302b. The lateral plane, e.g., the x-y plane, inductor structure 214 is located in may be referred to as the central plane of inductor structure 214. A dimension D of the outer periphery of inductor structure 214 may be equal to or greater than twice a distance L between a central plane of inductor structure 214 and a metal film (e.g., referring to metal film 5). In some embodiments, distance L is about 0.5 mm to about 2 mm, such as 0.5 mm, 0.8 mm, 1 mm, 1.2 mm, 1.5 mm, 2 mm. In some embodiments, distance L is about 1 mm. Dimension D of the outer periphery of inductor structure 214 may be in a range of about 1 mm to about 4 mm, such as 1 mm, 1.5 mm, 2 mm, 2.5 mm, 3 mm, 3.5 mm, 4 mm. In some embodiments, dimension D is about 2 mm. A width d of coil 304 may be in a range of about 0.1 mm to about 0.3 mm, such as 0.1 mm, 0.15 mm, 0.2 mm, 0.25 mm, 0.3 mm. In some embodiments, width d is about 0.2 mm.

In some embodiments, inductor structure 214 is located on (or in) an insulating layer (not shown) on base substrate 220 to insulate inductor structure 214 from other parts in and/on base substrate 220. The insulating layer may include any suitable materials such as ceramic, resin, plastic, silicon oxide, or a combination thereof. Inductor structure 214 may be attached/bonded onto base substrate 220 using an adhesive and/or bonding material, or be formed from a part of base substrate 220 as an integral part of base substrate 220.

Sensing chip 204 may include any integrated devices/parts that are configured to sense an inductance change in inductor structure 214. For example, sensing chip 204 may include magnetic materials, suitable capacitive devices, and/or amplifiers. Sensing chip 204 may be paired with inductor structure 214 to sense any inductance change in inductor structure 214 and generate an electrical current which is transmitted to motherboard 202 for processing. An arrow 230 represents an exemplary direction of the electrical current that flows from sensing chip 204 to motherboard 202. The electrical signal may reflect information of the deformation, which reflects the pressing on the shell. For example, the information may include the pressing strength and duration of the pressing. In some embodiments, sensing chip 204 are in contact with and conductively connected to packing substrate 206 through first solder balls 208. In some embodiments, sensing chip 204 is conductively connected to, e.g., operatively coupled to, motherboard 202 through first solder ball 208, package substrate 216, and second solder balls 210.

In various embodiments, sensing chip 204 may include a processing unit, e.g., a processor or a microprocessor, that can determine whether a deformation has occurred based on an inductance change, and send the result of the determination to motherboard 202 for further processing, e.g., operation control. For example, the electrical signal transmitted from sensing chip 204 to motherboard 202 may include data/information on whether any deformation has occurred on the shell of TWS headphone. The specific functions of sensing chip 204 and motherboard 202 should not be limited by the embodiments of the present disclosure.

In operation, inductor structure 214 may generate inductance when electrical current flows through. When a user presses the TWS headphone (e.g., a designated area on the TWS headphone), the shell of the TWS headphone may undergo deformation. The deformed shell may cause distance L between metal film 205 and inductor structure 214 to change, and the distance change may cause an inductance change in inductor structure 214. Sensing chip 204 may sense the inductance change and generate an electrical signal that can be transmitted to motherboard 202 through first solder balls 208, package substrate 206 (e.g., vias 212 and interposer layer 216), and second solder balls 210. The controller in motherboard 202 may receive and processing/analyze the electrical signal to determine an operation based on the result of the processing. In various embodiments, the electrical signal may include data and information that reflect the pressing strength and the duration of the pressing. In some embodiments, the operation includes any suitable operations that can be controlled by the controller, such as skipping a song, shutting off the TWS headphones, turning on the TWS headphones, etc.

Figure 4:
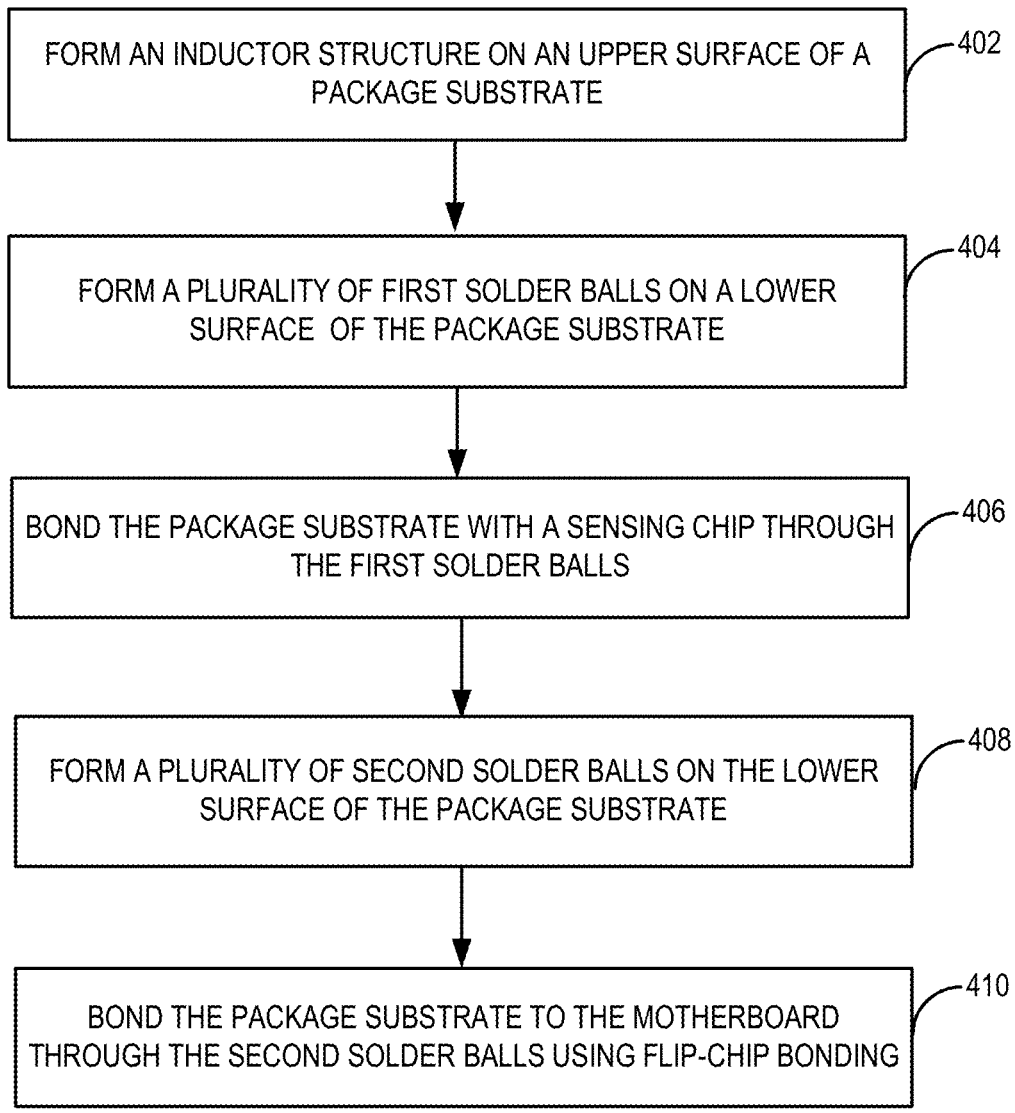
FIG. 4 is a flow chart illustrating an exemplary method for fabricating an integrated circuit package in accordance with embodiments of the present disclosure.

FIG. 4 is a flow chart illustrating an exemplary method 400 for forming an integrated circuit package in accordance with an embodiment. Method 400 can be performed by processing logic that can comprise hardware (e.g., circuitry, dedicated logic, programmable logic, microcode, etc.), software (e.g., instructions executing on a processing device), or a combination thereof. It is to be appreciated that not all operations may be needed to perform the disclosure provided herein. Further, some of the operations may be performed simultaneously, or in a different order than shown in FIG. 4, as will be understood by a person of ordinary skill in the art.

Method 400 shall be described with reference to FIGS. 2A, 2B, and 3. However, method 400 is not limited to that exemplary embodiment. Starting at 402, an inductor structure is formed on an upper surface of a package substrate. Referring back to FIGS. 2A and 2B, inductor structure 214 is formed on package substrate 206. Inductor structure 214 may be attached/bonded to an upper surface of package substrate 206 after it is formed, or may be formed from part of package substrate 206. In some embodiments, inductor structure 214 is formed and attached onto package substrate 206 (or base substrate 220) using a suitable adhesive. In some embodiments, differential terminals 302a and 302b of inductor structure 214 may be conductively connected to, e.g., in contact with, corresponding vias by a suitable bonding/attachment process. In some embodiments, inductor structure 214 is formed from part of package substrate 206. In some embodiments, inductor structure 214 is formed by patterning a conductive/ferromagnetic layer that is deposited on the upper surface of package substrate 206. The patterning process may include a suitable photolithography process and an etching process (e.g., dry and/or etch). For example, inductor structure 214 may have a layout as shown in FIG. 3. Inductor structure 214 may be attached to or formed on an insulating layer.

At 404, a plurality of first solder balls are formed on a lower surface of the package substrate. Referring back to FIGS. 2A and 2B, the lower surface of package substrate 206 may be the surface of package substrate 206 that is on the opposite side of the upper surface on which inductor structure 214 is formed/mounted. To form first solder balls 208, package substrate 206 may be flipped such that the lower surface may face up (i.e., above the upper surface). Any suitable method may be performed to form a plurality of first solder bumps that are in contact with the pins and/or vias 212 that are exposed on the lower surface of package substrate 206. For example, the first solder bumps may be disposed on package substrate 206 using laser solder ball jetting. The first solder bumps may be used to form first solder balls 208, and may be disposed to be in contact with pins and/or vias 212 that are to be conductively connected to sensing chip 204.

At 406, the package substrate and the sensing chip are bonded through the first solder balls. Referring back to FIGS. 2A and 2B, sensing chip 204 may be flipped and attached onto the lower surface such that corresponding pins on sensing chip 204 are aligned and in contact with respective solder bumps on package substrate 206. A reflow process (e.g., with heat and/or pressure) may be performed to liquefy the first solder bumps, forming a plurality of first solder balls 208 in contact with sensing chip 204 and package substrate 206 can be formed. Sensing chip 204 may thus be operatively coupled to package substrate 206. In some embodiments, sensing chip 204 is bonded onto package substrate 206 using flip-chip bonding.

At 408, a plurality of second solder balls are formed on the lower surface of package substrate. Referring back to FIGS. 2A and 2B, a plurality of second solder bumps may be formed on the lower surface of package substrate 206 at locations other than those of first solder balls 208. In some embodiments, the size of the second solder bumps may be greater than that of the first solder bumps such that the second solder balls can have a greater size to support package substrate 206 and prevent sensing chip 204 from touching motherboard 202. The second solder balls may be in contact with pins and/or vias 212 that are to be conductively connected to motherboard 202. The formation of the second solder balls may be similar to that of the first solder balls, and the detailed description is not repeated herein.

At 410, the package substrate and the motherboard are bonded through flip-chip bonding. Referring back to FIGS. 2A and 2B, package substrate 206 may be bonded onto motherboard 202 through flip-chip bonding. For example, package substrate 206 may be flipped over such that the lower surface, with sensing chip 204 attached, may be facing the upper surface of motherboard 202. Second solder bumps may be in contact and aligned with corresponding pins on motherboard 202. A reflow process (e.g., with heat and/or pressure) may be performed to liquefy the second solder bumps, forming a plurality of second solder balls 210 in contact with motherboard 202 and package substrate 206 can be formed. Motherboard 202 may thus be operatively coupled to package substrate 206.

It is noted that, when applicable, the solder bumps (or first and second solder balls 208 and 210) can also be formed on motherboard 202. In some embodiments, a suitable filler material may be injected to fill up the space between package substrate 206 and motherboard 202. In various embodiments, motherboard 202 may also be any other suitable semiconductor device on which BGA packaging can be employed as a packaging means. In various embodiments, the method and integrated circuit package can also be applied in the integration of any suitable devices in other system/devices, and should not be limited to the embodiments of the present disclosure.

Figure 5:
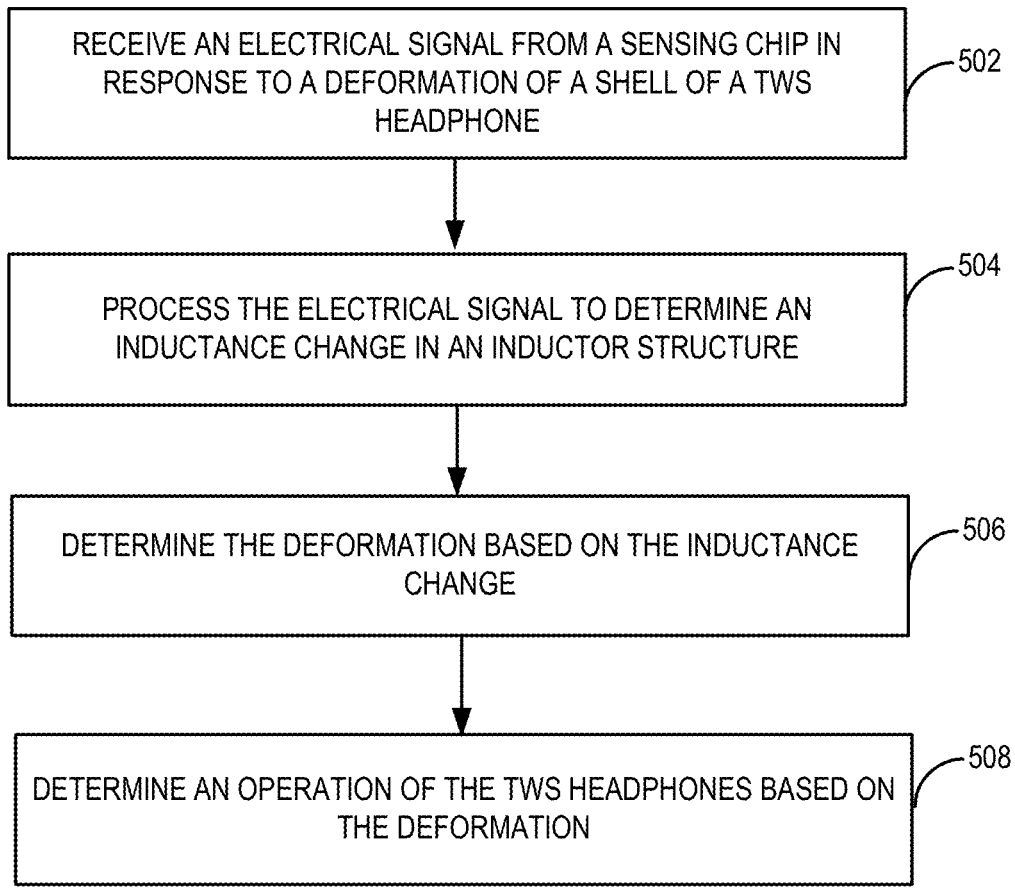
FIG. 5 is a flow chart illustrating an exemplary method for operation control using an integrated circuit package in accordance with embodiments of the present disclosure.

FIG. 5 is a flow chart illustrating an exemplary method 500 for operation control using an integrated circuit package in accordance with an embodiment. Method 500 can be performed by processing logic that can comprise hardware (e.g., circuitry, dedicated logic, programmable logic, microcode, etc.), software (e.g., instructions executing on a processing device), or a combination thereof. It is to be appreciated that not all operations may be needed to perform the disclosure provided herein. Further, some of the operations may be performed simultaneously, or in a different order than shown in FIG. 5, as will be understood by a person of ordinary skill in the art.

Method 500 shall be described with reference to FIGS. 2A and 2B. However, method 500 is not limited to that exemplary embodiment. Method 500 may be performed by the integrated circuit that includes the controller, inductor structure 214, sensing chip 20, and motherboard 202. In some embodiments, method 500 is performed by the controller. Starting at 502, an electrical signal is received from a sensing chip. This step may be performed by the controller (e.g., the processor) of the TWS headphones. The electrical signal may be generated by sensing chip 204 in response to an inductance change, which is caused by a deformation of the shell of a TWS headphone. Referring back to FIGS. 2A and 2B, when a user presses the shell of the TWS headphone, a deformation can be formed on the shell, and the deformation may cause distance L between metal film 205 and inductor structure 214 to change. An inductance change may occur in inductor structure 214, and sensing chip 204 may sense the inductance change and generate electrical current in response to the inductance change. The electrical current, represented by an arrow 230, may be transmitted from sensing chip 204 to motherboard 202 through first solder balls 208, package substrate 206, and second solder balls 210. The electrical current may include data and information that reflects the inductance change and further the deformation of the shell. For example, the data and information may include the pressing strength and/or the duration of the pressing. The controller, e.g., the processor, in motherboard 202, may receive the electrical signal.

At 504, the electrical signal is processed to determine an inductance change in an inductor structure. This step may be performed by the controller (e.g., the processor) of the TWS headphones. Referring back to FIGS. 2A and 2B, the controller, e.g., the processor, may receive and process the electrical signal to determine the inductance change in inductor structure 214.

At 506, the deformation is determined based on the inductance change. This step may be performed by the controller (e.g., the processor) of the TWS headphones. Referring back to FIGS. 2A and 2B, the controller, e.g., the processor, may determine the deformation on the shell of the TWS headphone based on the inductance change and/or electrical signal.

At 508, an operation of the TWS headphones is determined based on the deformation. This step be performed by the controller (e.g., the processor) of the TWS headphones. Referring back to FIGS. 2A and 2B, the controller, e.g., the processor, may determine an operation if a deformation (i.e., a pressing) is detected. Based on the data obtained from electrical signal, the controller may determine whether a user presses the shell of the TWS headphone, and if yes, the operation that corresponds to the type of pressing. For example, the types of pressing may include long press, short press, hard press, light press, etc. The operations may include, skipping a song, turning on the TWS headphones, turning off the TWS headphones, etc.

Embodiments of the present disclosure provide an integrated circuit package in a TWS headphone. The integrated circuit package includes a package substrate, an inductor structure, a sensing chip, and a semiconductor device. The inductor structure is on a first surface of the package substrate configured to sense a deformation of the TWS headphone. The sensing chip is attached to a second surface of the package substrate and configured to sense an inductance change in the inductor structure. The semiconductor device is attached to the second surface of the package substrate configured to process a sensed inductance change.

In some embodiments, the integrated circuit package further includes a plurality of first solder balls in contact with the package substrate and the sensing chip. The sensing chip is conductively connected to the package substrate through the plurality of first solder balls.

In some embodiments, the integrated circuit package further includes a plurality of second solder balls in contact with the package substrate and the semiconductor device. The semiconductor device is conductively connected to the package substrate through the plurality of second solder balls.

In some embodiments, the semiconductor device is conductively connected to the sensing chip through the plurality of first solder balls and second solder balls.

In some embodiments, the inductor structure is conductively connected to the semiconductor device through the plurality of second solder balls.

In some embodiments, the sensing chip is above the semiconductor device. In some embodiments, the package substrate is above the sensing chip. In some embodiments, the inductor structure is above the package substrate.

In some embodiments, the inductor structure comprises a planar coil.

In some embodiments, a dimension of an outer periphery of the inductor structure is equal to or greater than twice a distance between a central plane of the inductor structure and a metal film in the TWS headphone.

In some embodiments, the distance between a central plane of the inductor structure and a metal film is about 0.5 mm to about 2 mm. In some embodiments, the dimension of the outer periphery of the inductor structure is in a range of about 1 mm to about 4 mm.

In some embodiments, a width of the planar coils is in a range of about 0.1 mm to about 0.3 mm.

In some embodiments, the semiconductor device includes a motherboard configured to process an electrical signal reflecting the sensed inductance change from the sensing chip.

In some embodiments, the package substrate includes an interposer layer conductively connected to the sensing chip and the semiconductor device.

In some embodiments, the inductor structure is attached onto the first surface of the package substrate using an adhesive.

In some embodiments, the inductor structure is an integral part of the package substrate.

Embodiments of the present disclosure provide a method for operation control in TWS headphones. The method may be performed by an integrated circuit. The method includes sensing, by an inductor structure, a deformation of the TWS headphone. The inductor structure is positioned on a first surface of a package substrate and facing a metal film attached to a shell of the TWS headphones. The method also includes sensing, by a sensing chip, an inductance change in the inductor structure. The sensing chip is positioned on a second surface of the package substrate, the second surface being on an opposite side of the package substrate. The sensing chip is positioned on a second surface of the package substrate, the second surface being on an opposite side of the package substrate. The method further includes processing the sensed inductance change, by a semiconductor device positioned on a second surface of the package substrate, the second surface being on an opposite side of the package substrate. The method yet includes determining, by the semiconductor device, the deformation of the shell based on the inductance change and determining, by the semiconductor device, an operation of the TWS headphones, the sensing chip, based on the deformation of the shell.

In some embodiments, the inductor structure is a planar inductor having a coil in one layer on the package substrate.

In some embodiments, the package substrate is a BGA substrate.

In some embodiments, the package substrate is conductively connected to the sensing chip through a plurality of first solder balls.

In some embodiments, the package substrate is conductively connected to the processor through a plurality of second solder balls.

Embodiments of the present disclosure also provide an integrated circuit package in a TWS headphone. The integrated circuit package includes a package substrate, an inductor structure, a sensing chip, and a motherboard. The inductor structure is on a first surface of the package substrate. The sensing chip is attached to a second surface of the package substrate and configured to sense an inductance change caused by an interaction between the inductor structure and a metal film attached to a shell of the TWS headphones. The motherboard is attached to the second surface of the package substrate and configured to process an electrical signal from the sensing chip. The electrical signal reflects the inductance change.

It is to be appreciated that the Detailed Description section, and not the Summary and Abstract sections, is intended to be used to interpret the claims. The Summary and Abstract sections may set forth one or more but not all exemplary embodiments of the present disclosure as contemplated by the inventor(s), and thus, are not intended to limit the present disclosure or the appended claims in any way.

While the present disclosure has been described herein with reference to exemplary embodiments for exemplary fields and applications, it should be understood that the present disclosure is not limited thereto. Other embodiments and modifications thereto are possible, and are within the scope and spirit of the present disclosure. For example, and without limiting the generality of this paragraph, embodiments are not limited to the software, hardware, firmware, and/or entities illustrated in the figures and/or described herein. Further, embodiments (whether or not explicitly described herein) have significant utility to fields and applications beyond the examples described herein.

Embodiments have been described herein with the aid of functional building blocks illustrating the implementation of specified functions and relationships thereof. The boundaries of these functional building blocks have been arbitrarily defined herein for the convenience of the description. Alternate boundaries can be defined as long as the specified functions and relationships (or equivalents thereof) are appropriately performed. Also, alternative embodiments may perform functional blocks, steps, operations, methods, etc. using orderings different than those described herein.

The breadth and scope of the present disclosure should not be limited by any of the above-described exemplary embodiments, but should be defined only in accordance with the following claims and their equivalents.

What is claimed is:

1. An integrated circuit package in a true wireless stereo (TWS) headphone, comprising:
    a package substrate;
    an inductor structure on a first surface of the package substrate configured to sense a deformation of the TWS headphone;
    a sensing chip attached to a second surface of the package substrate and configured to sense an inductance change in the inductor structure; and
    a semiconductor device attached to the second surface of the package substrate configured to process the sensed inductance change.

2. The integrated circuit package of claim 1, further comprising a plurality of first solder balls in contact with the package substrate and the sensing chip, wherein the sensing chip is conductively connected to the package substrate through the plurality of first solder balls.

3. The integrated circuit package of claim 2, further comprising a plurality of second solder balls in contact with the package substrate and the semiconductor device, wherein the semiconductor device is conductively connected to the package substrate through the plurality of second solder balls.

4. The integrated circuit package of claim 3, wherein the semiconductor device is conductively connected to the sensing chip through the plurality of first solder balls and second solder balls.

5. The integrated circuit package of claim 3, wherein the inductor structure is conductively connected to the semiconductor device through the plurality of second solder balls.

6. The integrated circuit package of claim 1, wherein:
    the sensing chip is above the semiconductor device;
    the package substrate is above the sensing chip; and
    the inductor structure is above the package substrate.

7. The integrated circuit package of claim 1, wherein the inductor structure comprises a planar coil.

8. The integrated circuit package of claim 7, wherein a dimension of an outer periphery of the inductor structure is equal to or greater than twice a distance between a central plane of the inductor structure and a metal film in the TWS headphone.

9. The integrated circuit package of claim 7, wherein the distance between a central plane of the inductor structure and a metal film is about 0.5 mm to about 2 mm; the dimension of the outer periphery of the inductor structure is in a range of about 1 mm to about 4 mm.

10. The integrated circuit package of claim 7, wherein a width of the planar coils is in a range of about 0.1 mm to about 0.3 mm.

11. The integrated circuit package of claim 1, wherein the semiconductor device comprises a motherboard configured to process an electrical signal reflecting the sensed inductance change from the sensing chip.

12. The integrated circuit package of claim 1, wherein the package substrate comprises an interposer layer conductively connected to the sensing chip and the semiconductor device.

13. The integrated circuit package of claim 1, wherein the inductor structure is attached onto the first surface of the package substrate using an adhesive.

14. The integrated circuit package of claim 1, wherein the inductor structure is an integral part of the package substrate.

15. A method for operation control in true wireless stereo (TWS) headphones, by an integrated circuit, comprising:
    sensing, by an inductor structure, a deformation of the TWS headphone, wherein the inductor structure is positioned on a first surface of a package substrate and facing a metal film attached to a shell of the TWS headphones;
    sensing, by a sensing chip, an inductance change in the inductor structure, wherein the sensing chip is positioned on a second surface of the package substrate, the second surface being on an opposite side of the package substrate;
    processing the sensed inductance change, by a semiconductor device positioned on a second surface of the package substrate, the second surface being on an opposite side of the package substrate;
    determining, by the semiconductor device, the deformation of the shell based on the inductance change; and
    determining, by the semiconductor device, an operation of the TWS headphones, the sensing chip, based on the deformation of the shell.

16. The method of claim 15, wherein the inductor structure is a planar inductor comprising a coil in one layer on the package substrate.

17. The method of claim 15, wherein the package substrate is a ball-grid-array (BGA) substrate.

18. The method of claim 17, wherein the package substrate is conductively connected to the sensing chip through a plurality of first solder balls.

19. The method of claim 17, wherein:
    the package substrate is conductively connected to the processor through a plurality of second solder balls.

20. An integrated circuit package in a true wireless stereo (TWS) headphone, comprising:
    a package substrate;
    an inductor structure on a first surface of the package substrate;
    a sensing chip attached to a second surface of the package substrate and configured to sense an inductance change caused by an interaction between the inductor structure and a metal film attached to a shell of the TWS headphones; and
    a motherboard attached to the second surface of the package substrate and configured to process an electrical signal from the sensing chip, the electrical signal reflecting the inductance change.

* * * * *